United States Patent
Choi

(10) Patent No.: US 12,170,260 B2
(45) Date of Patent: Dec. 17, 2024

(54) SEMICONDUCTOR PACKAGE AND METHOD OF MANUFACTURING THE SAME

(71) Applicant: JMJ Korea Co., Ltd., Bucheon-si (KR)

(72) Inventor: Yun Hwa Choi, Bucheon-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 523 days.

(21) Appl. No.: 17/543,617

(22) Filed: Dec. 6, 2021

(65) Prior Publication Data

US 2022/0285304 A1 Sep. 8, 2022

(30) Foreign Application Priority Data

Mar. 2, 2021 (KR) .................... 10-2021-0027532

(51) Int. Cl.
*H01L 23/00* (2006.01)
*H01L 23/498* (2006.01)
*H01L 25/065* (2023.01)

(52) U.S. Cl.
CPC ........ *H01L 24/16* (2013.01); *H01L 23/49816* (2013.01); *H01L 24/81* (2013.01); *H01L 25/0655* (2013.01); *H01L 2224/10155* (2013.01); *H01L 2224/16227* (2013.01); *H01L 2224/81801* (2013.01)

(58) Field of Classification Search
None
See application file for complete search history.

(56) References Cited

U.S. PATENT DOCUMENTS

2017/0103906 A1* 4/2017 Han .................. H01L 21/563

FOREIGN PATENT DOCUMENTS

| KR | 10-2011-0123461 A | 11/2011 |
| KR | 10-2012-0062434 A | 6/2012 |
| KR | 10-2013-0009441 A | 1/2013 |
| KR | 10-2017-0041518 A | 4/2017 |
| KR | 10-1807420 B1 | 12/2017 |
| KR | 10-2018-0046258 A | 5/2018 |
| KR | 10-2019-0091799 A | 8/2019 |
| KR | 10-2068078 B1 | 1/2020 |

* cited by examiner

*Primary Examiner* — Telly D Green
(74) *Attorney, Agent, or Firm* — Park, Kim & Suh, LLC

(57) ABSTRACT

Provided is a semiconductor package including: a pad substrate on which a semiconductor chip is installed; a solder formed on the pad substrate having a length same as or longer than a side of the semiconductor chip; and an intagliated groove formed on the pad substrate having a length longer than at least the side of the semiconductor chip and filled with at least a certain amount of melted solder, wherein the solder having a thickness of at least 1 μm or above is filled in the intagliated groove to have a length of at least 3 μm or above and an intermetallic compound layer is formed on a certain area included in an inner wall of the intagliated groove. Accordingly, movement of the semiconductor chip may be restricted so that the quality of following processes may be improved, and electrical and mechanical combination between the solder and the pad substrate may be stabled.

15 Claims, 10 Drawing Sheets

METAL PAD SUBSTRATE TYPE

INSULATION SUBSTRATE PAD TYPE

SEMICONDUCTOR PACKAGE AND METHOD OF MANUFACTURING THE SAME

CROSS-REFERENCE TO RELATED PATENT APPLICATION

This application claims the benefit of Korean Patent Application No. 10-2021-0027532, filed on Mar. 2, 2021, in the Korean Intellectual Property Office, the disclosure of which is incorporated herein in its entirety by reference.

BACKGROUND OF THE INVENTION

1. Field of the Invention

The present invention relates to a semiconductor package and a method of manufacturing the same, wherein the semiconductor package includes intagliated grooves formed around semiconductor chips so as to minimize spread of melted solder and to restrict movement of the semiconductor chips from their installed positions so that the quality of following processes may be improved, and electrical and mechanical combination between the solder and a pad substrate may be stabled.

2. Description of the Related Art

In general, solder is used to bond a semiconductor chip, in particular, a power semiconductor, to a metal part of a pad substrate. Here, the semiconductor chip is bonded on the pad substrate by using melted solder.

Since the melted solder spreads and is diffused on a metal surface of the pad substrate, the semiconductor chip moves without intention and is separated from an originally installed position. This affects the quality of following processes. Accordingly, in order to prevent such movement, an epoxy adhesive or a PI film is used to form a wall around a semiconductor chip and then, spread of the melted solder may be blocked.

In this regard, Korean Patent Application Publication No. 10-2017-0041518 is disclosed. According to a conventional method of manufacturing a semiconductor package, a first nozzle N1' is used to spray a low-temperature first solution and dams 310' are formed to surround an installation area of semiconductor chips 220', so that undesired separation of the semiconductor chips 220' to passive devices 120' placed around the semiconductor chips 220' and external terminals may be prevented, as illustrated in FIG. 1.

However, such a method needs an additional process of forming the dams 310' on a package substrate 100' and thus, it is inefficient in terms of costs. Also, the dams 310' are protruded from the package substrate 100' and thus, there is substantial limitation in terms of design.

Therefore, forming intagliated grooves having various patterns around semiconductor chips at low cost and minimizing spread of melted solder are required.

SUMMARY OF THE INVENTION

The present invention provides a semiconductor package and a method of manufacturing the same, wherein the semiconductor package includes intagliated grooves having various patterns formed around semiconductor chips on a pad substrate by using a laser processing so as to minimize spread of melted solder and to restrict movement of the semiconductor chips from their installed positions so that the quality of following processes may be improved, and electrical and mechanical combination between the solder and the pad substrate may be stabled.

According to an aspect of the present invention, there is provided a semiconductor package including: a pad substrate on which a semiconductor chip is installed; a solder formed on the pad substrate having a length same as or longer than a side of the semiconductor chip; and an intagliated groove formed on the pad substrate having a length longer than at least the side of the semiconductor chip and filled with at least a certain amount of melted solder, wherein the solder having a thickness of at least 1 μm or above is filled in the intagliated groove to have a length of at least 3 μm or above and an intermetallic compound layer is formed on a certain area included in an inner wall of the intagliated groove.

The pad substrate may include at least one metal layer and an uppermost metal layer is formed of any one metal including Cu, Ag, Au, and Ni or a metal compound containing 50% or more of any one metal including Cu, Ag, Au, and Ni.

The pad substrate may include at least one insulation layer and an uppermost metal layer of the insulation layer is formed of any one metal including Cu, Ag, Au, and Ni or a metal compound containing 50% or more of any one metal including Cu, Ag, Au, and Ni.

The insulation layer may be formed of $Al_2O_3$, AlN, PI, or $Si_3N_4$.

The semiconductor package may further include metal projections having certain heights from the surface of the pad substrate at the outer edge of the intagliated groove.

At least one metal projections may be formed to have a height of above 1 μm and a length of above 2 μm.

The solder may include any one of Sn, Ag, Pb, and Sb.

The intagliated groove may be laser processed to have patterns.

The semiconductor chip and the pad substrate may include a solder void interposed therebetween which is below 15% against the area of the semiconductor chip.

The intagliated groove may have a depth of 3 μm through 150 μm.

The intagliated groove may have a depth same as or smaller than a depth of the semiconductor chip.

The intagliated groove may have at least one tetragonal pattern having each different size or a circular or elliptical pattern separately formed or combined on the outer area of the semiconductor chip formed on the pad substrate.

The intagliated groove may have at least one line pattern which is longer than the side of the semiconductor chip on the outer area of the semiconductor chip formed on the pad substrate.

The intagliated groove may be engraved to have a V-letter or a U-letter hollow shape.

The intermetallic compound layer on the inner wall of the intagliated groove may contain Sn, Ag, or Pb The intermetallic compound layer may be formed in surrounding areas of the metal projections and contains Sn, Ag, or Pb.

The intermetallic compound layer on the inner wall of the intagliated groove may be formed at a temperature of above 150° C.

The upper surface of the semiconductor chip may be covered by an epoxy molding compound (EMC).

The semiconductor chip may be an insulated gate bipolar transistor (IGBT), a diode, or a metal oxide semiconductor field-effect transistor (MOSFET).

The semiconductor chip may be applied as a component of an inverter, a converter, or an on board charger (OBC).

According to another aspect of the present invention, there is provided a method of manufacturing a semiconductor package including: preparing of a semiconductor chip; preparing of a pad substrate, on which the semiconductor chip is installed; laser processing of an intagliated groove formed on the pad substrate having a length longer than at least a side of the semiconductor chip and filled with at least a certain amount of melted solder; and soldering of the solder on the pad substrate to have a length same as or longer than the side of the semiconductor chip, wherein the solder having a thickness of at least 1 μm or above is filled in the intagliated groove to have a length of at least 3 μm or above and an intermetallic compound layer is formed on a certain area included in an inner wall of the intagliated groove.

The pad substrate may include at least one metal layer and an uppermost metal layer is formed of any one metal including Cu, Ag, Au, and Ni or a metal compound containing 50% or more of any one metal including Cu, Ag, Au, and Ni.

The pad substrate may include at least one insulation layer and an uppermost metal layer of the insulation layer is formed of any one metal including Cu, Ag, Au, and Ni or a metal compound containing 50% or more of any one metal including Cu, Ag, Au, and Ni.

The intagliated groove may have at least one tetragonal pattern having each different size or a circular or elliptical pattern separately formed or combined on the outer area of the semiconductor chip formed on the pad substrate.

The intagliated groove may have at least one line pattern which is longer than the side of the semiconductor chip on the outer area of the semiconductor chip formed on the pad substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
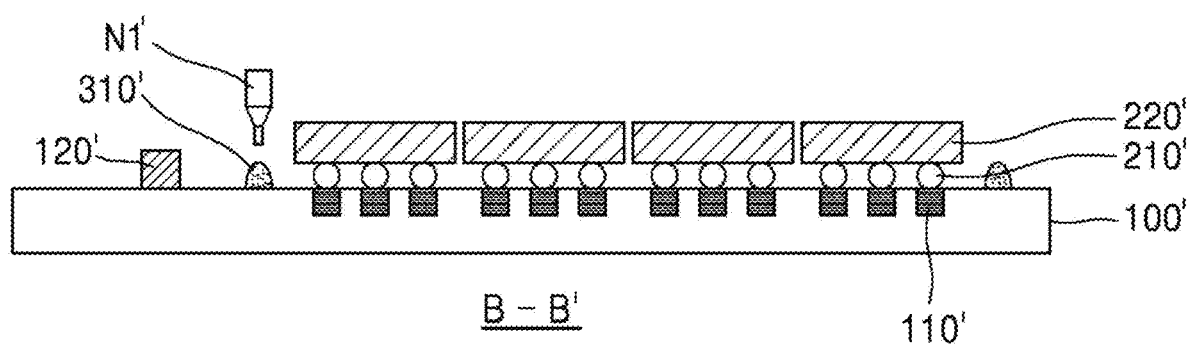
FIG. 1 illustrates a conventional semiconductor chip package having intagliated patterns.
Figure 2A:
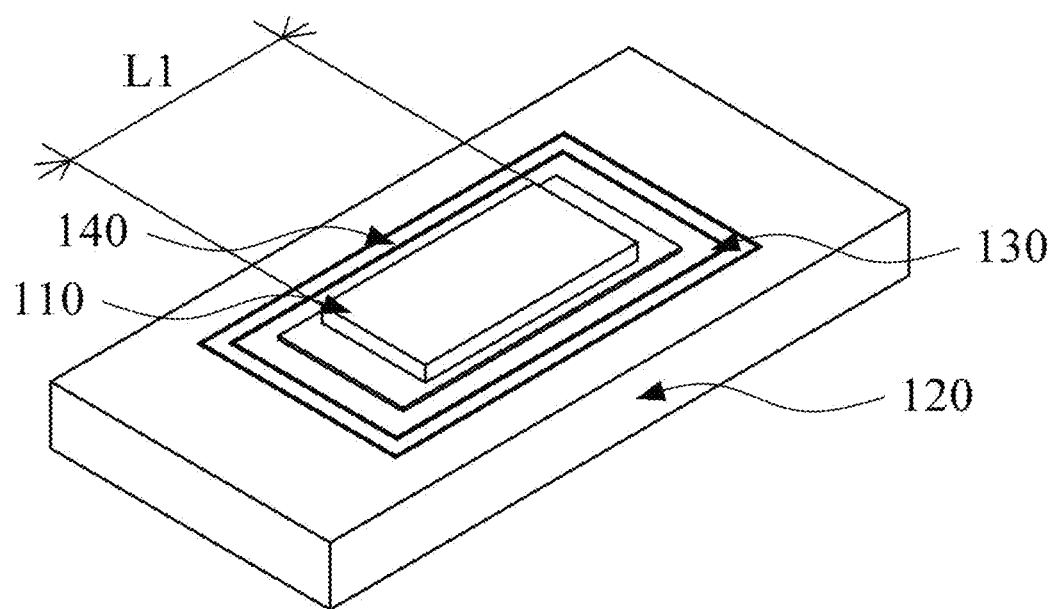
FIGS. 2A through 3C schematically illustrate semiconductor packages according to an embodiment of the present invention.
Figure 2B:
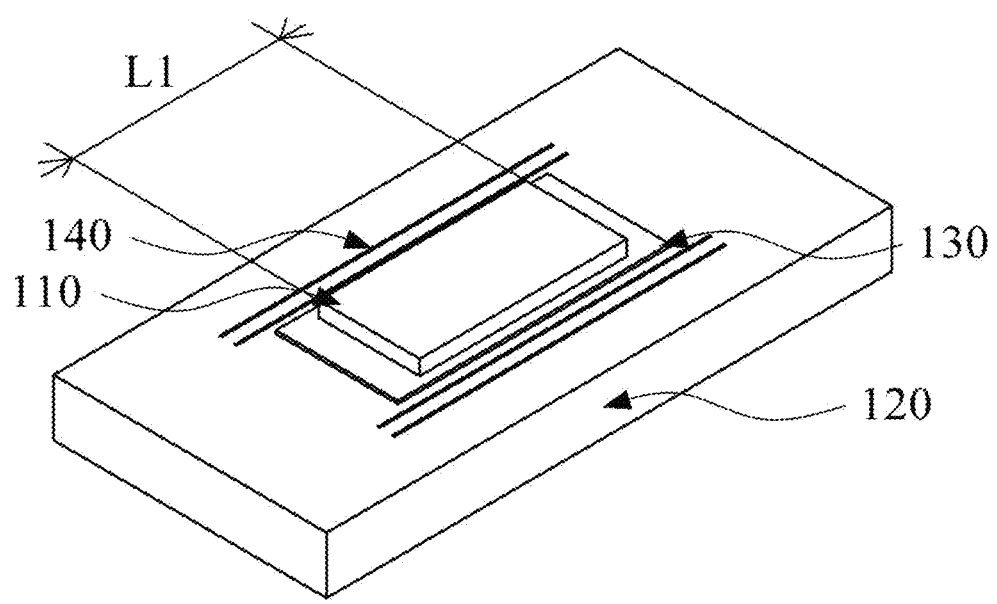
Figure 2C:
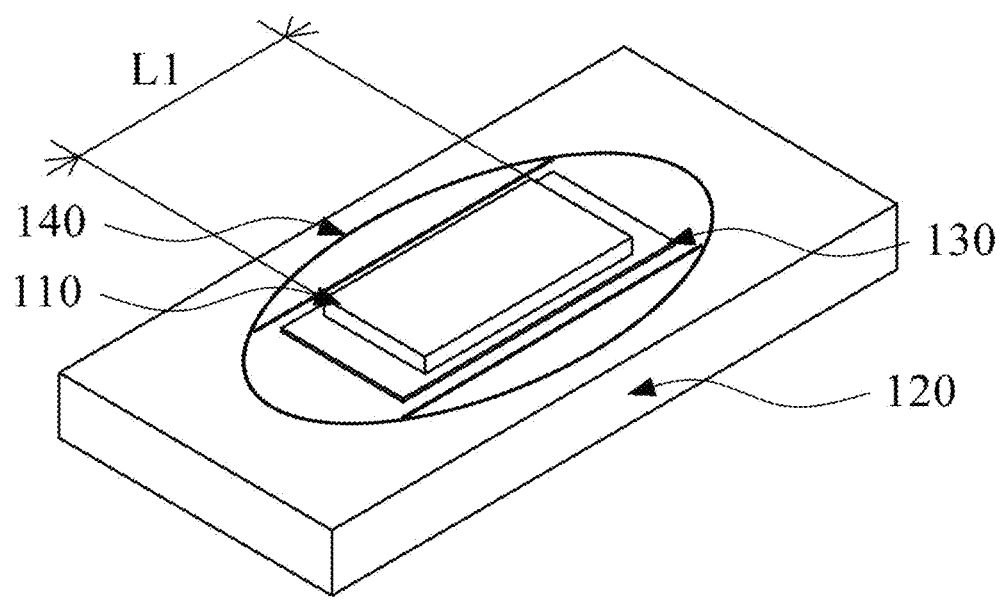

Hereinafter, the present invention will be described in more detail with reference to the accompanying drawings so as to be easily implemented by those of ordinary skill in the art. This invention may be embodied in many alternate forms and should not be construed as limited to only the exemplary embodiments set forth herein.

A semiconductor package according to an embodiment of the present invention includes a pad substrate 120 on which a semiconductor chip 110 is installed, a solder 130 formed on the pad substrate 120 having a length same as or longer than a side L1 of the semiconductor chip 110, and an intagliated groove 140 formed on the pad substrate 120 having a length longer than at least the side L1 of the semiconductor chip 110, wherein the intagliated groove 140 is filled with at least a certain amount of melted solder 130. The solder 130 having a thickness of at least 1 μm or above is filled in the intagliated groove 140 to have a length of at least 3 μm or above and an intermetallic compound layer 150 is formed on a certain area included in an inner wall of the intagliated groove 140. Accordingly, movement of the semiconductor chip 110 may be restricted so that the quality of following processes may be improved, and electrical and mechanical combination between the solder 130 and the pad substrate 120 may be stabled.

Hereinafter, the semiconductor package according to a first embodiment of the present invention described above will be described in more detail with reference to FIGS. 2A through 7.

Firstly, the solder 130 is installed on the pad substrate 120 and then, the semiconductor chip 110, for example, a power semiconductor, is installed on a metal part of the pad substrate 120 so as to be electrically connected to each other.

Figure 4A:
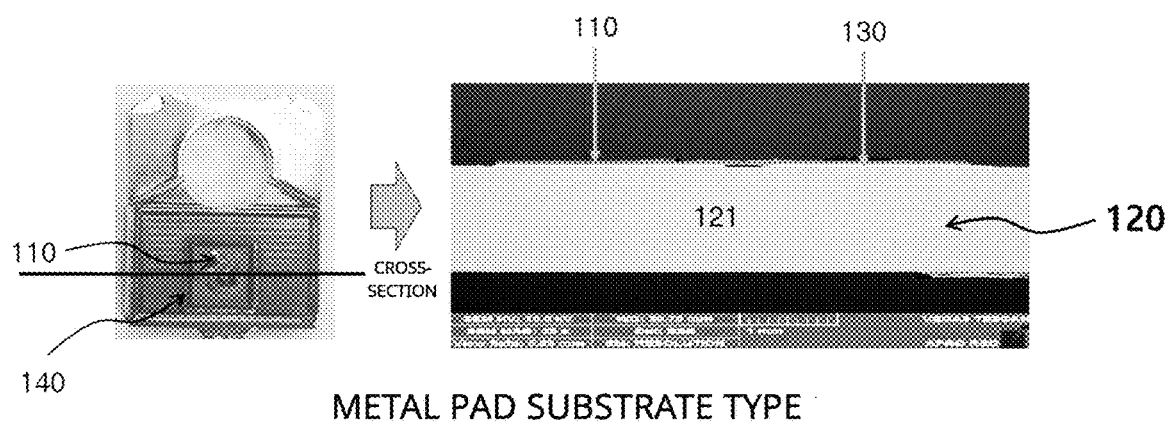
FIGS. 4A and 4B illustrate photographs and cross-sectional views of the semiconductor package according to an embodiment of the present invention.

For example, the semiconductor chip 110 is bonded to a lead frame pad or an insulation substrate pad of the metal. As illustrated in FIG. 4A, if the pad substrate 120 is a metal pad type, the pad substrate 120 including a lead frame pad is formed in such a way that at least one metal layer 121 is stacked. Here, the uppermost metal layer, on which the semiconductor chip 110 is installed, may be formed of any one metal including Cu, Ag, Au, and Ni or a metal compound containing 50% or more of any one metal including Cu, Ag, Au, and Ni.

Figure 4B:
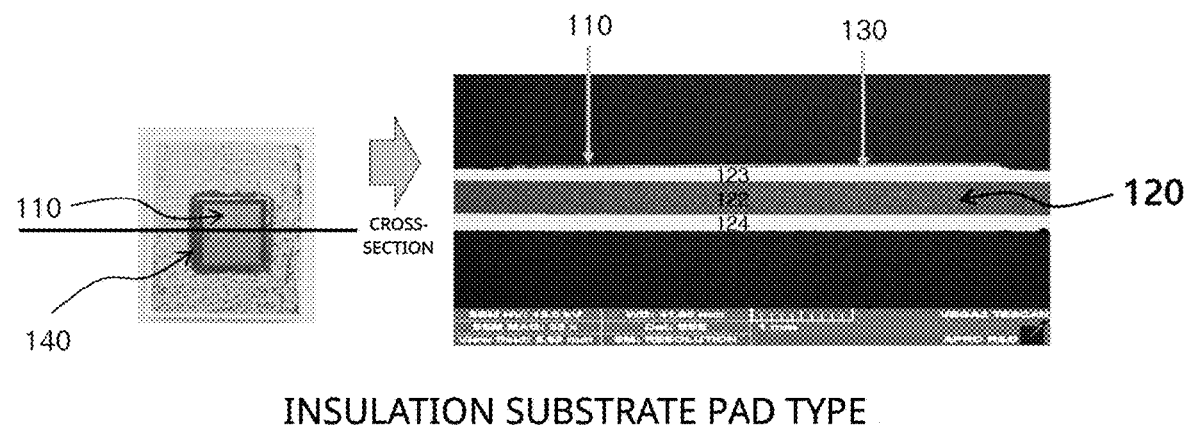

Also, as illustrated in FIG. 4B, if the pad substrate 120 is an insulation substrate pad type, the pad substrate 120 includes at least one insulation layer 122. Here, an uppermost metal layer 123 formed on the insulation layer 122, on which the semiconductor chip 110 is installed, may be formed of any one metal including Cu, Ag, Au, and Ni or a metal compound containing 50% or more of any one metal including Cu, Ag, Au, and Ni.

Figure 6:
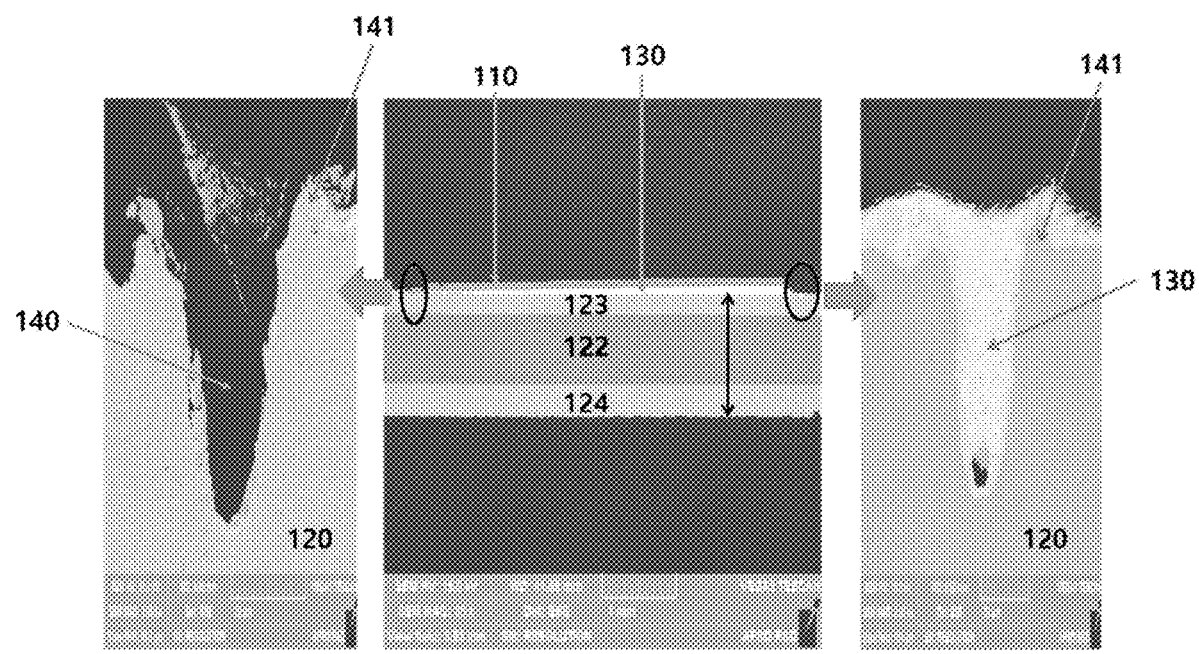
FIG. 6 respectively illustrates a pad substrate of the semiconductor package of FIGS. 4A and 4B and scanning electron microscope (SEM) photographs.

Here, the insulation layer 122 may be formed of $Al_2O_3$, AlN, PI, or $Si_3N_4$. Referring to FIGS. 4B and 6, an upper metal layer, which is the uppermost layer 123 formed of any one of Cu, Ag, Au, and Ni, and a lower metal layer 124 may be respectively stacked on the upper part and the lower part of the insulation layer 122.

In addition, the semiconductor chip 110 may be an insulated gate bipolar transistor (IGBT), which is a fast switching device, a diode, a metal oxide semiconductor field-effect transistor (MOSFET), a thyristor, a gate turn-off thyristor (GTO), or a triac and may be applied as a component of an inverter, a converter, or an on board charger (OBC).

A sealing member, in particular, an epoxy molding compound (EMC), is covered and molded on the upper surface of the semiconductor chip 110 and thus, seals the semiconductor chip 110. Accordingly, the semiconductor chip 110 may be protected from external shock, heat, water, or contamination.

Next, the solder 130 is formed on the metal part of the pad substrate 120 and is melted by soldering. Then, the melted solder 130 bonds the semiconductor chip 110 to the uppermost metal layer 123 of the pad substrate 120.

Here, the solder 130 is formed to be the same as the side L1 of the semiconductor chip 110 or longer than the side L1 of the semiconductor chip 110 and thus, is stably bonded to the pad substrate 120.

Also, the solder 130 may include any one of Sn, Ag, Pb, and Sb.

Next, the intagliated groove 140 is formed in various patterns around the semiconductor chip 110 on the pad substrate 120 by using laser processing. More specifically, the intagliated groove 140 is formed to have a length longer than the at least the side L1 of the semiconductor chip 110 and thus, is filled with the melted solder 130 so as to block the melted solder 130 from being spread on the uppermost metal layer 123 of the pad substrate 120. Accordingly, the installation position of the semiconductor chip 110 may not be moved so as not to affect the quality of following processes.

Figure 3A:
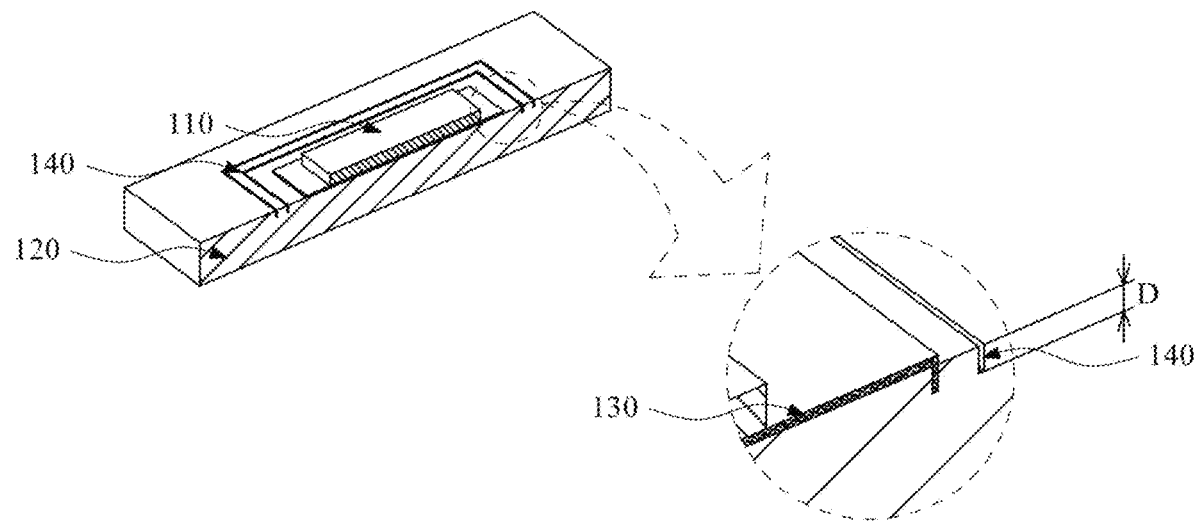
Figure 3B:
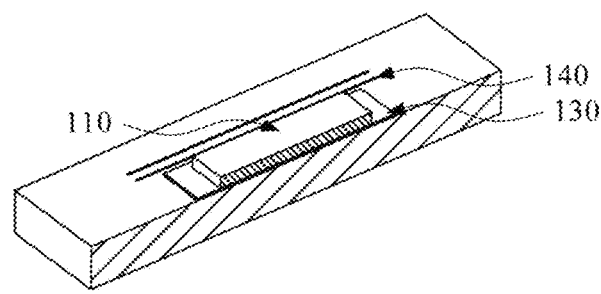
Figure 3C:
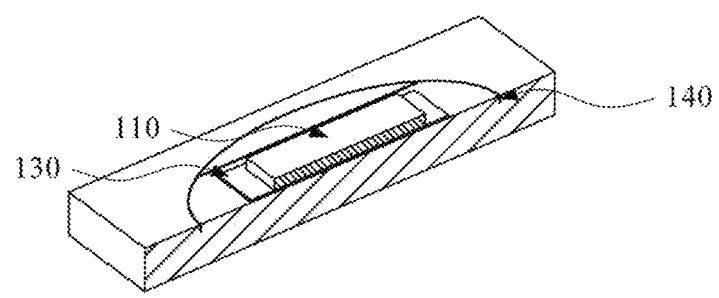

That is, referring to FIG. 3A, when the solder 130 melted while soldering spreads to the side on the uppermost metal layer 123, the melted solder 130 partially flows into the intagliated groove 140 and is blocked from further spread to the outside of the intagliated groove 140. Thus, the solder 130 may be prevented from being melted and moved over a range needed to bond the semiconductor chip 110.

For example, referring to FIG. 3A, the intagliated groove 140 may be laser processed to have a depth D of 3 μm through 150 μm and is filled with the solder 130 having a thickness of at least 1 μm or above to have a length of at least 3 μm or above. Also, the intermetallic compound layer 150 having a semiconductor character may be formed on a certain area included in an inner wall of the intagliated groove 140.

According to a standard or specification of the semiconductor chip 110, the intagliated groove 140 may be laser processed to have the depth D same as or smaller than a depth of the semiconductor chip 110.

As illustrated in FIGS. 2A through 3C, the intagliated groove 140 may be formed to have various patterns by using laser processing in such a way that at least one tetragonal pattern having each different size (refer to FIG. 3A) or a circular or elliptical pattern (refer to FIG. 3C) are separately formed or combined on the outer area of the semiconductor chip 110 formed on the pad substrate 120.

Also, the intagliated groove 140 may have at least one line pattern (refer to FIG. 3B) which is longer than the side L1 of the semiconductor chip 110 on the outer area of the semiconductor chip 110 formed on the pad substrate 120.

Figure 5A:
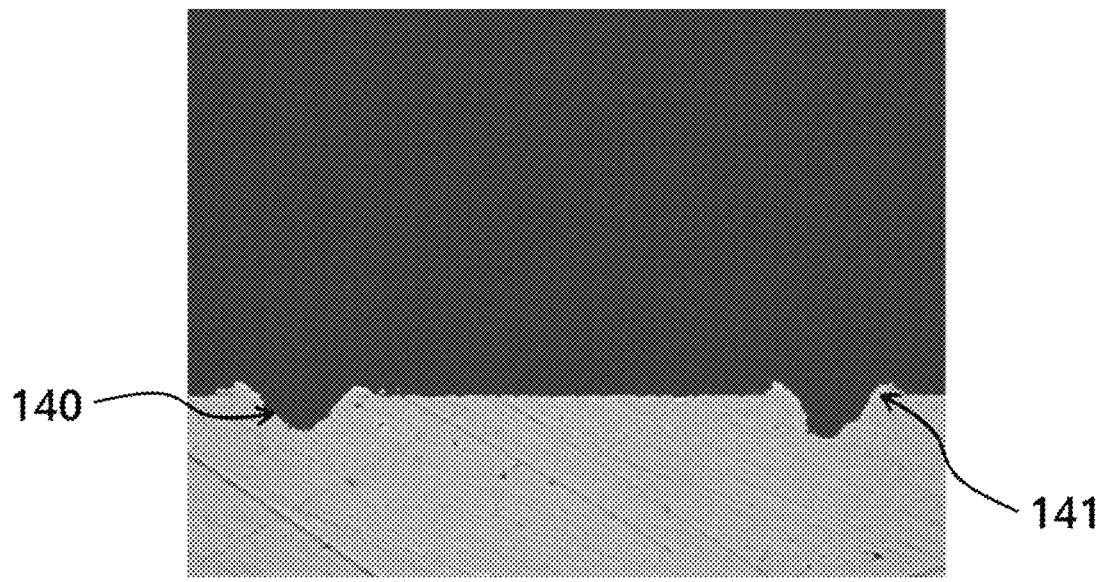
FIGS. 5A and 5B illustrate enlarged views of intagliated grooves of the semiconductor package of FIGS. 4A and 4B.
Figure 5B:
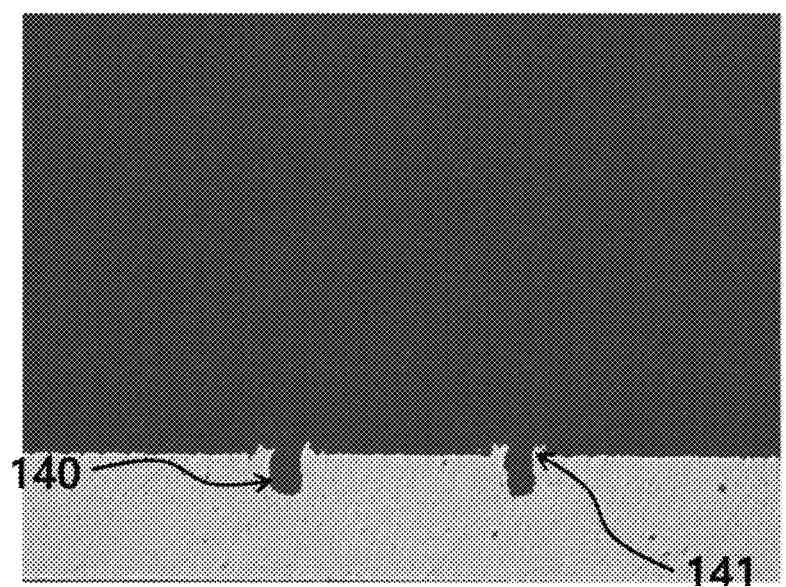

In addition, as illustrated in FIGS. 5A and 5B, the intagliated groove 140 may be engraved to have a V-letter (refer to FIG. 5A) or a U-letter (refer to FIG. 5B) hollow shape, and metal projections 141 having certain heights from the surface of the uppermost metal layer contacting the solder 130 are formed at the outer edge of the intagliated groove 140. Accordingly, a contact surface with the solder 130 and surface roughness are enlarged to increase the bonding strength between the semiconductor chip 110 and the pad substrate 120. Also, water permeation into the intagliated groove 140 through a micrometer-sized gap between the metal projections 141 and the solder 130 is blocked to prevent inside corrosion. Here, at least one metal projection 141 may be formed to have a height of above 1 μm and a length of above 2 μm.

A solder void between the semiconductor chip 110 and the pad substrate 120 may be preferably below 15% against the area of the semiconductor chip 110. Here, since the spread of the melted solder 130 is blocked by the intagliated groove 140 having various patterns formed on the outer area of the semiconductor chip 110 on the pad substrate 120, it is realized that a solder void is reduced to 15% or below against the area of the semiconductor chip 110 and thereby, electrical characteristics and heat transfer characteristics between the semiconductor chip 110 and the pad substrate 120 may be stably maintained.

Figure 7:
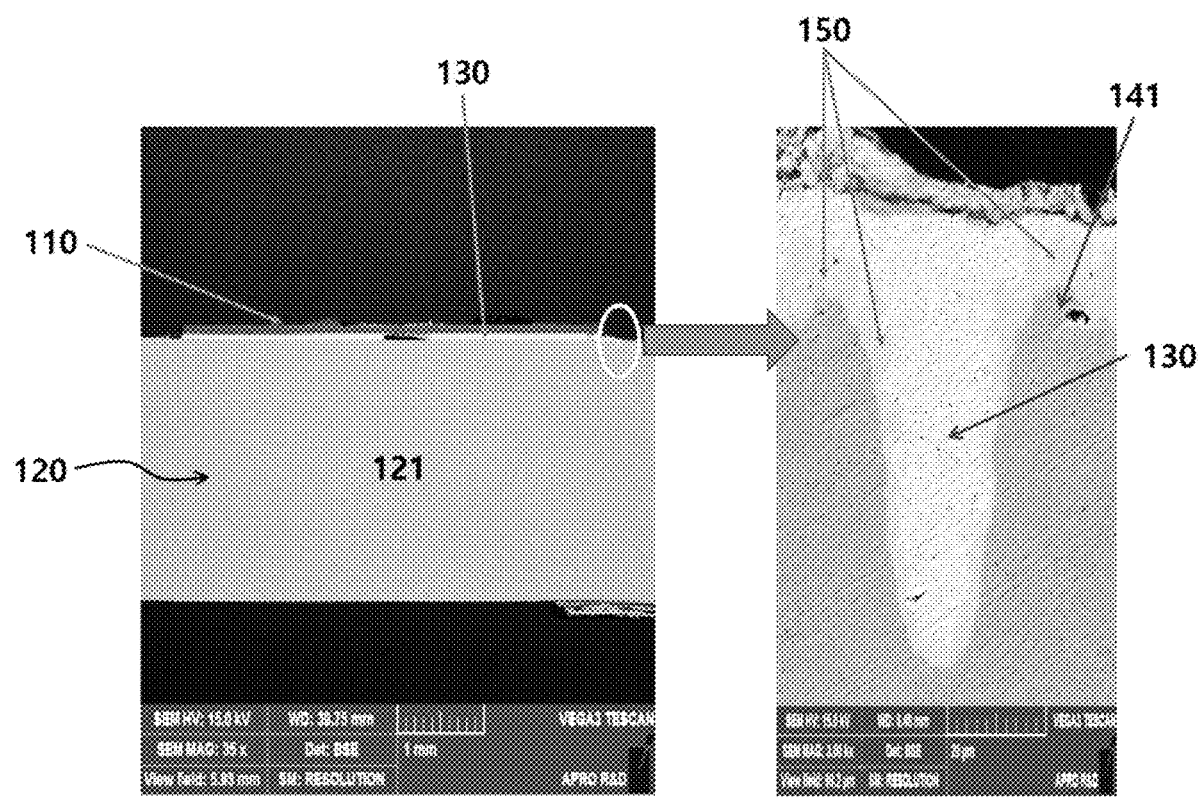
FIG. 7 is an enlarged view of a SEM photograph of an intermetallic compound layer in the semiconductor package of FIGS. 4A and 4B.

As described above, the intermetallic compound layer 150 is formed on a certain area included in an inner wall of the intagliated groove 140 and surrounding areas of the metal projections 141 at a temperature of above 150° C., as illustrated in FIGS. 6 and 7, and may contain Sn, Ag, or Pb.

Figure 8:
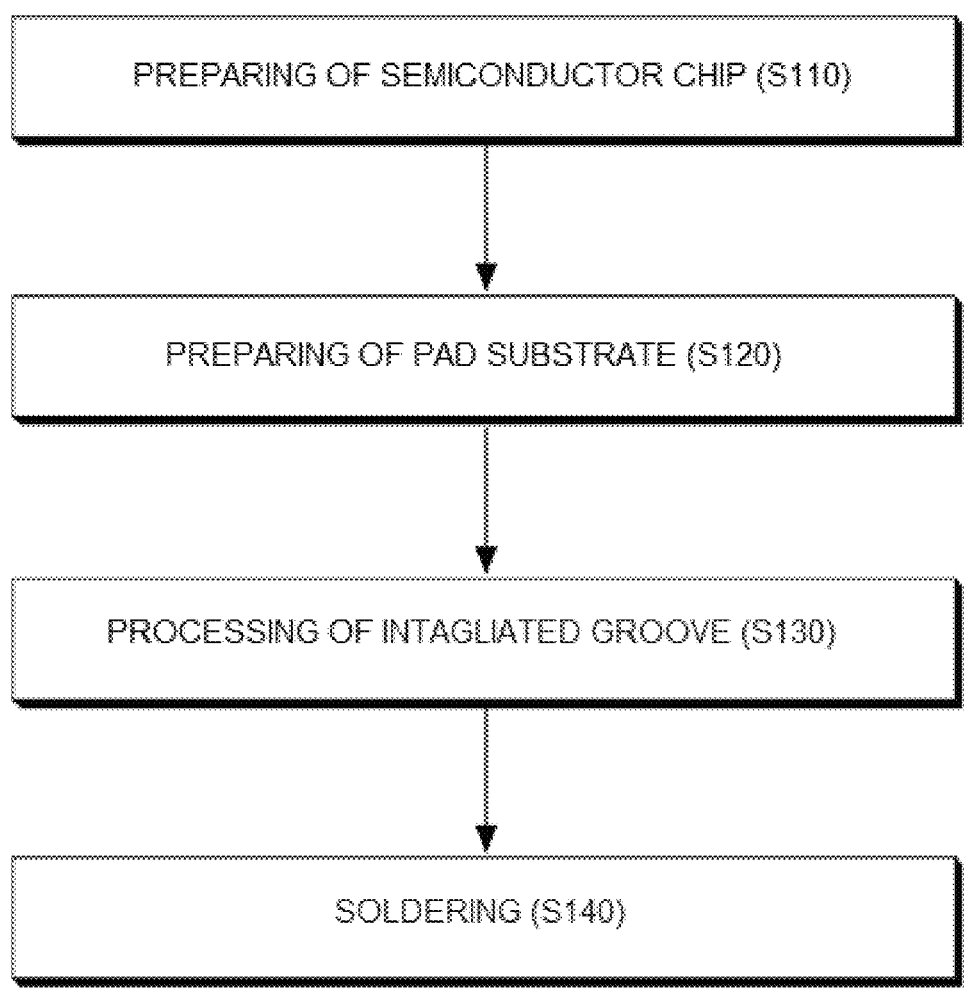
FIG. 8 is a flowchart schematically illustrating a method of manufacturing a semiconductor package according to another embodiment of the present invention.

FIG. 8 is a flowchart schematically illustrating a method of manufacturing a semiconductor package according to another embodiment of the present invention. Referring to FIG. 8, the method includes preparing of a semiconductor chip, in operation S110, preparing of a pad substrate, on which the semiconductor chip is installed, in operation S120, laser processing of an intagliated groove formed on the pad substrate having a length longer than at least a side of the semiconductor chip and filled with at least a certain amount of melted solder, in operation S130, and soldering of the solder on the pad substrate to have a length same as or longer than the side of the semiconductor chip, in operation S140. The solder having a thickness of at least 1 μm or above is filled in the intagliated groove to have a length of at least 3 μm or above and the intermetallic compound layer is formed on a certain area included in an inner wall of the intagliated groove. Accordingly, movement of the semiconductor chip may be restricted so that the quality of following processes may be improved, and electrical and mechanical combination between the solder and the pad substrate may be stabled.

Here, the semiconductor chip 110 is bonded to a lead frame pad or an insulation substrate pad of the metal. As illustrated in FIG. 4A, if the pad substrate 120 is a metal pad type, the pad substrate 120 including a lead frame pad is formed in such a way that at least one metal layer 121 is stacked. Here, the uppermost metal layer, on which the semiconductor chip 110 is installed, may be formed of any one metal including Cu, Ag, Au, and Ni or a metal compound containing 50% or more of any one metal including Cu, Ag, Au, and Ni.

Also, as illustrated in FIG. 4B, if the pad substrate 120 is an insulation substrate pad type, the pad substrate 120 includes at least one insulation layer 122. Here, the uppermost metal layer 123 formed on the insulation layer 122, on which the semiconductor chip 110 is installed, may be formed of any one metal including Cu, Ag, Au, and Ni or a metal compound containing 50% or more of any one metal including Cu, Ag, Au, and Ni.

Here, the insulation layer 122 may be formed of $Al_2O_3$, AlN, PI, or $Si_3N_4$. Referring to FIGS. 4B and 6, an upper metal layer, which is the uppermost layer 123 formed of any one of Cu, Ag, Au, and Ni, and the lower metal layer 124 may be respectively stacked on the upper part and the lower part of the insulation layer 122.

The solder 130 is formed on the metal part of the pad substrate 120 and is melted by soldering. Then, the melted solder 130 bonds the semiconductor chip 110 to the uppermost metal layer 123 of the pad substrate 120. Here, the solder 130 is formed to be the same as the side L1 of the semiconductor chip 110 or longer than the side L1 of the semiconductor chip 110 and thus, is stably bonded to the pad substrate 120.

Also, the solder 130 may include any one of Sn, Ag, Pb, and Sb.

In addition, the intagliated groove 140 is formed in various patterns around the semiconductor chip 110 on the pad substrate 120 by using laser processing. More specifically, the intagliated groove 140 is formed to have a length longer than the at least the side L1 of the semiconductor chip 110 and thus, is filled with the melted solder 130 so as to block the melted solder 130 from being spread on the uppermost metal layer 123 of the pad substrate 120. Accordingly, the installation position of the semiconductor chip 110 may not be moved so as not to affect the quality of following processes.

That is, referring to FIG. 3A, when the solder 130 melted while soldering spreads to the side on the uppermost metal layer 123, the melted solder 130 partially flows into the intagliated groove 140 and is blocked from further spread to the outside of the intagliated groove 140. Thus, the solder 130 may be prevented from being melted and moved over a range needed to bond the semiconductor chip 110.

For example, referring to FIG. 3A, the intagliated groove 140 may be laser processed to have the depth D of 3 μm through 150 μm and is filled with the solder 130 having a thickness of at least 1 μm or above to have a length of at least 3 μm or above. Also, the intermetallic compound layer 150 having a semiconductor character may be formed on a certain area included in an inner wall of the intagliated groove 140.

According to a standard or specification of the semiconductor chip 110, the intagliated groove 140 may be laser processed to have the depth D same as or smaller than the depth of the semiconductor chip 110.

As illustrated in FIGS. 2A through 3C, the intagliated groove 140 may be formed to have various patterns by using laser processing in such a way that at least one tetragonal pattern having each different size (refer to FIG. 3A) or a circular or elliptical pattern (refer to FIG. 3C) are separately formed or combined on the outer area of the semiconductor chip 110 formed on the pad substrate 120.

Also, the intagliated groove 140 may have at least one line pattern (refer to FIG. 3B) which is longer than the side L1 of the semiconductor chip 110 on the outer area of the semiconductor chip 110 formed on the pad substrate 120.

In addition, as illustrated in FIGS. 5A and 5B, the intagliated groove 140 may be engraved to have a V-letter (refer to FIG. 5A) or a U-letter (refer to FIG. 5B) hollow shape, and the metal projections 141 having certain heights from the surface of the uppermost metal layer contacting the solder 130 are formed at the outer edge of the intagliated groove 140. Accordingly, a contact surface with the solder 130 and surface roughness are enlarged to increase the bonding strength between the semiconductor chip 110 and the pad substrate 120. Also, water permeation into the intagliated groove 140 through a micrometer-sized gap between the metal projections 141 and the solder 130 is blocked to prevent inside corrosion. Here, at least one metal projection 141 may be formed to have a height of above 1 μm and a height of above 2 μm.

Therefore, according to the semiconductor package and the method of manufacturing the same described above, the intagliated groove is formed around the semiconductor chip to minimize the spread of the melted solder. Accordingly, movement of the semiconductor chip may be restricted from its installation position so that the quality of following processes may be improved, and electrical and mechanical combination between the solder and the pad substrate may be stabled.

According to the present invention, the intagliated groove having various patterns is formed around the semiconductor chip on the pad substrate by using laser processing to minimize the spread of the melted solder. Accordingly, movement of the semiconductor chip may be restricted from its installation position so that the quality of following processes may be improved, and electrical and mechanical combination between the solder and the pad substrate may be stabled.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
   a pad substrate on which a semiconductor chip is installed;
   a solder formed on the pad substrate having a length same as or longer than a side of the semiconductor chip; and
   an intagliated groove formed on the pad substrate having a length longer than at least the side of the semiconductor chip and filled with at least a certain amount of melted solder,
   wherein the solder having a thickness of at least 1 μm or above is filled in the intagliated groove to have a length of at least 3 μm or above and an intermetallic compound layer is formed on a certain area included in an inner wall of the intagliated groove.

2. The semiconductor package of claim 1, wherein the pad substrate comprises at least one metal layer and an uppermost metal layer is formed of any one metal comprising Cu, Ag, Au, and Ni or a metal compound containing 50% or more of any one metal comprising Cu, Ag, Au, and Ni.

3. The semiconductor package of claim 1, wherein the pad substrate comprises at least one insulation layer and an uppermost metal layer of the insulation layer is formed of any one metal comprising Cu, Ag, Au, and Ni or a metal compound containing 50% or more of any one metal comprising Cu, Ag, Au, and Ni.

4. The semiconductor package of claim 1, further comprising metal projections having certain heights from the surface of the pad substrate at the outer edge of the intagliated groove.

5. The semiconductor package of claim 4, wherein at least one metal projections are formed to have a height of above 1 μm and a length of above 2 μm.

6. The semiconductor package of claim 1, wherein the intagliated groove is laser processed to have patterns.

7. The semiconductor package of claim 1, wherein the semiconductor chip and the pad substrate comprise a solder void interposed therebetween which is below 15% against the area of the semiconductor chip.

8. The semiconductor package of claim 1, wherein the intagliated groove has a depth of 3 μm through 150 μm.

9. The semiconductor package of claim 1, wherein the intagliated groove has a depth same as or smaller than a depth of the semiconductor chip.

10. The semiconductor package of claim 1, wherein the intagliated groove has at least one tetragonal pattern having each different size or a circular or elliptical pattern separately formed or combined on the outer area of the semiconductor chip formed on the pad substrate.

11. The semiconductor package of claim 1, wherein the intagliated groove has at least one line pattern which is longer than the side of the semiconductor chip on the outer area of the semiconductor chip formed on the pad substrate.

12. The semiconductor package of claim 1, wherein the intermetallic compound layer on the inner wall of the intagliated groove contains Sn, Ag, or Pb.

13. The semiconductor package of claim 4, wherein the intermetallic compound layer is formed in surrounding areas of the metal projections and contains Sn, Ag, or Pb.

14. The semiconductor package of claim 1, wherein the intermetallic compound layer on the inner wall of the intagliated groove is formed at a temperature of above 150° C.

15. The semiconductor package of claim 1, wherein the semiconductor chip is applied as a component of an inverter, a converter, or an on board charger (OBC).

* * * * *